US012740255B2

(12) United States Patent
Ryu et al.

(10) Patent No.: US 12,740,255 B2
(45) Date of Patent: Sep. 15, 2026

(54) DISPLAY APPARATUS

(71) Applicant: LG DISPLAY CO., LTD., Seoul (KR)

(72) Inventors: HoJin Ryu, Paju-si (KR); SeJune Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 506 days.

(21) Appl. No.: 18/314,907

(22) Filed: May 10, 2023

(65) Prior Publication Data

US 2023/0403891 A1 Dec. 14, 2023

(30) Foreign Application Priority Data

Jun. 10, 2022 (KR) ........................ 10-2022-0070898

(51) Int. Cl.
*H10K 59/88* (2023.01)
*H10D 30/67* (2025.01)
*H10K 59/124* (2023.01)
*H10K 59/126* (2023.01)

(52) U.S. Cl.
CPC ....... *H10K 59/124* (2023.02); *H10D 30/6729* (2025.01); *H10K 59/126* (2023.02); *H10K 59/88* (2023.02)

(58) Field of Classification Search
CPC ............. H10D 30/6729; H10D 86/443; H10D 86/451; H10D 86/60; H10D 1/60–716; H10K 50/11; H10K 50/841–8428
See application file for complete search history.

(56) References Cited

U.S. PATENT DOCUMENTS 7,846,825 B2 12/2010 Kang et al.
11,716,893 B2 8/2023 Kim
2012/0120357 A1* 5/2012 Jiroku ............... G02F 1/136227 349/138
2016/0043349 A1* 2/2016 Park ....................... H10K 59/12 257/40
2017/0351152 A1 12/2017 Hashiguchi et al.
2019/0131365 A1* 5/2019 Jung .................. H10K 59/8722
2019/0206975 A1* 7/2019 Hiramatsu ............. H10K 71/60
2021/0181554 A1* 6/2021 Hong .................... G02F 1/1368
(Continued)

FOREIGN PATENT DOCUMENTS

JP 2019-120751 A 7/2019
KR 20080061181 A * 7/2008 ............. H10K 71/00
KR 10-2015-0024575 A 3/2015
(Continued)

*Primary Examiner* — Steven B Gauthier
*Assistant Examiner* — Adam D Weiland
(74) *Attorney, Agent, or Firm* — Birch, Stewart, Kolasch & Birch, LLP

(57) ABSTRACT

A display apparatus including a substrate; a thin film transistor (TFT) provided on a first emission region of the substrate; a plurality of dummy patterns provided on a second emission region of the substrate adjacent to the first emission region; a planarization layer provided on the TFT and the plurality of dummy patterns; and a light emitting device including a first electrode provided on the planarization layer, an emission layer provided on the first electrode, and a second electrode provided on the emission layer. Further, a drain electrode of the TFT extends from the first emission region to the second emission region and is electrically connected with the first electrode of the light emitting device.

20 Claims, 4 Drawing Sheets

(56) References Cited

U.S. PATENT DOCUMENTS

| | | | | |
|---|---|---|---|---|
| 2022/0020734 | A1* | 1/2022 | Lim | H01L 25/167 |
| 2022/0359790 | A1 | 11/2022 | Lee et al. | |

FOREIGN PATENT DOCUMENTS

| | | | |
|---|---|---|---|
| KR | 10-2016-0130071 | A | 11/2016 |
| KR | 10-2021-0033683 | A | 3/2021 |
| KR | 10-2021-0074561 | A | 6/2021 |
| WO | WO 2014/020817 | A1 | 2/2014 |

* cited by examiner

DISPLAY APPARATUS

CROSS-REFERENCE TO RELATED APPLICATIONS

This application claims the benefit under 35 U.S.C. § 119(a) to Patent Application No. 10-2022-0070898, filed in Republic of Korea on Jun. 10, 2022, which is hereby expressly incorporated by reference into the present application.

BACKGROUND

Field of the Invention

The present disclosure relates to a display apparatus.

Discussion of the Related Art

Various display apparatuses such as liquid crystal display (LCD) apparatuses, plasma display panels (PDPs), and electroluminescent display (ELD) apparatuses are being used recently. Also, ELD apparatuses include organic light emitting display apparatuses and quantum-dot light emitting display (QLED) apparatuses.

The ELD apparatuses are self-emitting display apparatuses and do not need a separate backlight. Therefore, the organic light emitting display apparatuses is lightweight and thin and has low power consumption compared to LCD apparatuses. Also, ELD apparatuses are driven with a direct current (DC) low voltage, have a fast response time, and are low in manufacturing cost.

In the related art, in order to increase an opening ratio of an emission region, a structure is used where a drain electrode of a thin film transistor and an anode electrode of a light emitting device contact each other in the emission region. In this instance, a contact hole is formed in a planarization layer formed between the drain electrode and the anode electrode, for contact between the drain electrode and the anode electrode. However, because a thickness of the planarization layer formed between the drain electrode and anode electrode is thick, an angle between a lateral surface and a lower surface of a contact hole increases. Therefore, based on a depth and an angle of the contact hole, a thickness of an emission layer formed in the contact hole decreases, or a cathode electrode can be short-circuited in the contact hole.

SUMMARY

Accordingly, the present disclosure is directed to providing a display apparatus that substantially obviates one or more problems due to limitations and disadvantages of the related art.

An aspect of the present disclosure is directed to providing a display apparatus in which a step height of a contact hole formed in an emission region is reduced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including an emission region and a non-emission region, a thin film transistor (TFT) and a plurality of dummy patterns provided on the substrate, a planarization layer provided on the TFT and the plurality of dummy patterns, and a light emitting device provided on the planarization layer, wherein the emission region includes a first emission region where the TFT is provided and a second emission region where the plurality of dummy patterns are provided, a drain electrode of the TFT extends to the second emission region, and the drain electrode and the light emitting device are electrically connected with each other in the second emission region.

According to the present disclosure, in an emission region, a plurality of dummy patterns may be formed under a contact hole where a light emitting device is connected with a drain electrode, and thus, an opening ratio of the emission region may increase and the light emitting device may be stably formed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
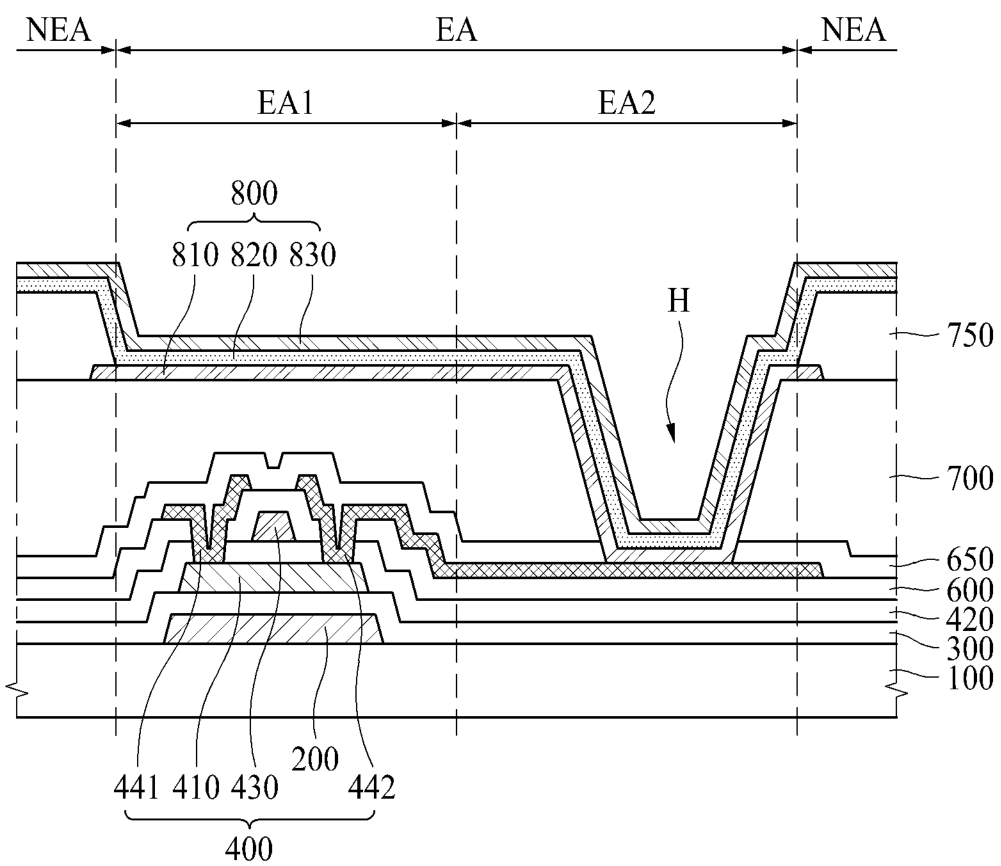
FIG. 1 is a cross-sectional view of a related art display apparatus.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When 'comprise', 'have', and 'include' described in the present specification are used, another part may be added unless 'only-' is used. The terms of a singular form may include plural forms unless referred to the contrary.

In construing an element, the element is construed as including an error range although there is no explicit description. In describing a position relationship, for example, when a position relation between two parts is described as 'on~', 'over~', 'under~', and 'next~', one or more other parts may be disposed between the two parts unless 'just' or 'direct' is used. In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
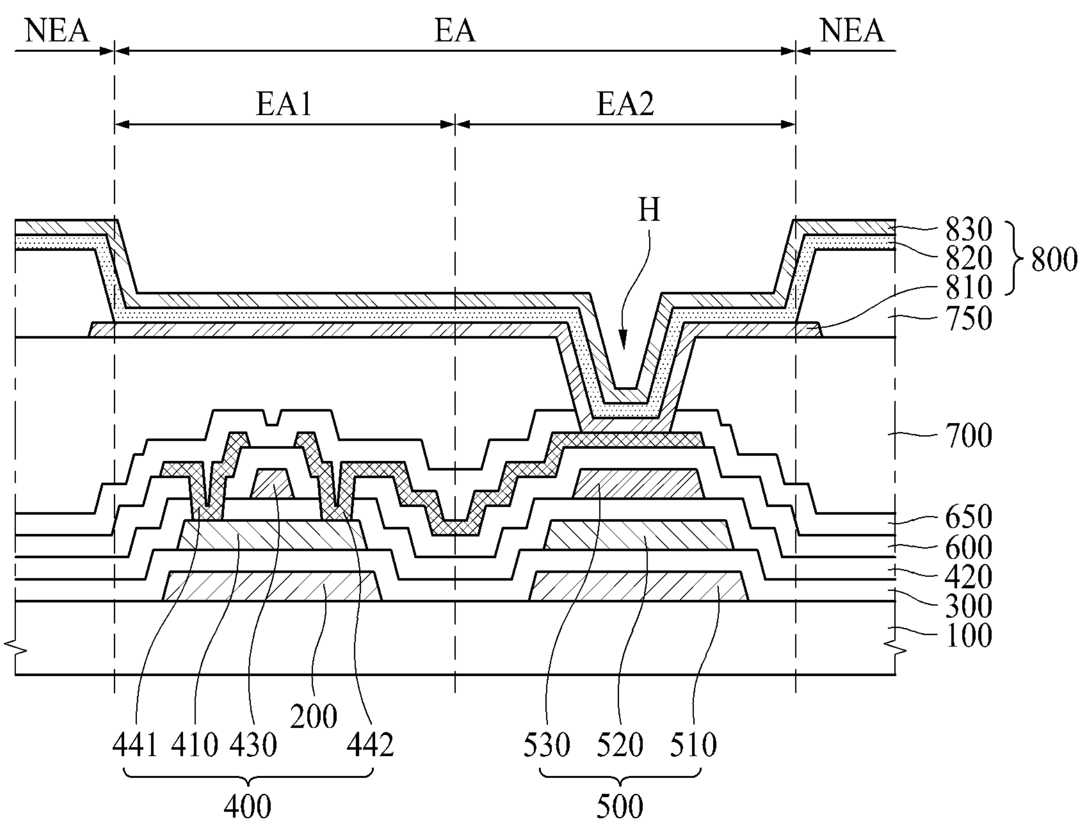
FIG. 2 is a cross-sectional view of a display apparatus according to a first embodiment of the present disclosure.

Hereinafter, embodiments of the present disclosure will be described in detail with reference to the accompanying drawings. FIG. 2 is a cross-sectional view of a display apparatus 10 according to a first embodiment of the present disclosure.

Referring to FIG. 2, the display apparatus according to the first embodiment of the present disclosure includes an emission region EA and a non-emission region NEA. Also, the emission region EA includes a first region EA1 where a driving thin film transistor (TFT) 400 is disposed and a second region EA2 where a plurality of dummy patterns 500 are disposed.

A substrate 100, a blocking layer 200, a buffer layer 300, the driving TFT 400, an interlayer insulation layer 600, a passivation layer 650, a planarization layer 700, a bank 750, and a light emitting device 800 are also provided in the first region EA1 of the emission region EA. The substrate 100 may include glass or plastic, but embodiments of the present disclosure are not limited thereto and the substrate 100 may include a semiconductor material such as a silicon wafer.

An electroluminescent display apparatus according to the first embodiment of the present disclosure can be implemented as a top emission type where emitted light is discharged upward, and thus, a material of the substrate 100 can use an opaque material as well as a transparent material.

Further, the blocking layer 200 is formed on the substrate 100 and may include a conductive material for blocking light. The blocking layer 200 may include a metal material such as aluminum (Al), silver (Ag), copper (Cu), molybdenum (Mo), titanium (Ti), tungsten (W), or chromium (Cr), or an alloy thereof. Also, the blocking layer 200 is illustrated as a single layer, but is not limited thereto and can be formed of a multilayer. For example, the blocking layer 200 can be formed a double layer, and the double layer can include a lower layer and an upper layer which include different materials. In this instance, the lower layer may include a Mo—Ti alloy (MoTi) and the upper layer may include Cu, but embodiments of the present disclosure are not limited thereto.

In addition, the buffer layer 300 can be formed to cover the blocking layer 200, on the substrate 100. The buffer layer 300 may include silicon nitride (SiNx) or silicon oxide (SiOx). Also, the buffer layer 300 is illustrated as a single layer, but is not limited thereto and can be formed of a multilayer. The buffer layer 300 can insulate the blocking layer 200 and enhance an adhesive force between the substrate 100 and layers formed on the buffer layer 300.

Further, as shown, the driving TFT 400 is formed on the buffer layer 300 and disposed at a position overlapping the blocking layer 200. Accordingly, the blocking layer 200 is disposed under the driving TFT 400, and thus, prevents external light from affecting the driving TFT 400, thereby enhancing the reliability of the driving TFT 400.

In addition, as shown, the driving TFT 400 includes a semiconductor layer 410, a gate insulation layer 420, a gate electrode 430, a source electrode 441, and a drain electrode 442. The semiconductor layer 410 of the driving TFT 400 is formed on the buffer layer 300 and may include a polysilicon semiconductor or an oxide semiconductor. Also, when the semiconductor layer 410 includes an oxide semiconductor, the semiconductor layer 410 can include at least one oxide of indium-gallium-zinc-oxide (IGZO), indium-zinc-oxide (IZO), indium-gallium-tin-oxide (IGTO), and indium-gallium-oxide (IGO).

The gate insulation layer 420 of the driving TFT 400 is formed on the semiconductor layer 410 and insulates the gate electrode 430 from the semiconductor layer 410. The gate insulation layer 420 may include SiNx or SiOx. Also, the gate insulation layer 420 is illustrated as a single layer, but is not limited thereto and may be formed of a multilayer.

Further, the gate electrode 430 of the driving TFT 400 is formed on the gate insulation layer 420. The gate electrode 430 can be formed on the gate insulation layer 420 to overlap a channel region of the semiconductor layer 410.

In addition, the gate electrode 430 of the driving TFT 400 can be electrically connected with the blocking layer 200. Accordingly, the blocking layer 200 including a conductive material can be electrically stabilized and prevent the blocking layer 200 from hindering a normal operation of the semiconductor layer 410. Similarly, the blocking layer 200 can be electrically connected with the gate electrode 430 of the driving TFT 400, and thus, the driving TFT 400 according to an embodiment of the present disclosure can implement a double gate electrode structure. Accordingly, a current characteristic of the driving TFT 400 can be improved, and reliability can be enhanced.

In addition, the interlayer insulation layer 600 is formed on the gate insulation layer 420 and the gate electrode 430 of the driving TFT 400. The interlayer insulation layer 600 may include an organic insulating material such as acryl resin, epoxy resin, phenolic resin, polyamide resin, or polyimide resin.

A contact hole for exposing the semiconductor layer 410 of the driving TFT 400 is also formed in the gate insulation layer 420 of the driving TFT 400 and the interlayer insulation layer 600. Further, the source electrode 441 and the drain electrode 442 of the driving TFT 400 face each other and are formed on the interlayer insulation layer 600. Also, each of the source electrode 441 and the drain electrode 442 of the driving TFT 400 are connected with the semiconductor layer 410 through the contact hole which is formed in the gate insulation layer 420 and the interlayer insulation layer 600.

In addition, the passivation layer 650 is formed on the driving TFT 400 and protects the driving TFT 400. Also, the passivation layer 650 may include an inorganic insulating material such as SiOx or SiNx, but embodiments of the present disclosure are not limited thereto.

Further, the planarization layer 700 is formed on the passivation layer 650 and compensates for a step height caused by the driving TFT 400 and contact holes. The planarization layer 700 may include an inorganic insulating material such as SiOx or SiNx. Alternatively, the planarization layer 700 may include an organic insulating material such as acryl resin, epoxy resin, phenolic resin, polyamide resin, or polyimide resin.

As shown, the light emitting device 800 is formed on the planarization layer 700 and includes a first electrode 810, an emission layer 820, and a second electrode 830. In more detail, the first electrode 810 is formed on the planarization layer 700 and can function as an anode of a display apparatus. The first electrode 310 is also electrically connected with the drain electrode 442 of the driving TFT 400.

In addition, the first electrode 810 may include a transparent conductive material such as indium tin oxide (ITO) or indium zinc oxide (IZO). Alternatively, the first electrode 810 may include a metal material such as Al, Ag, Cu, Mo, Ti, W, or Cr, or an alloy thereof. Also, the first electrode 810 is illustrated as a single layer, but is not limited thereto and can be formed of a multilayer.

The bank 750 is formed on the planarization layer 700 and the first electrode 810 and defines the emission region EA and the non-emission region NEA. That is, a region where the bank 750 is not formed is the emission region EA, and a region where the bank 750 is formed is the non-emission region NEA.

In addition, the bank 750 may include an organic insulating material such as acryl resin, epoxy resin, phenolic resin, polyamide resin, or polyimide resin. Alternatively, the bank 750 may include an inorganic insulating material such as silicon nitride, aluminum nitride, zirconium nitride, silicon oxide, titanium nitride, hafnium nitride, tantalum nitride, silicon oxide, aluminum oxide, or titanium oxide. Also, the bank 750 may include a black dye, for absorbing light incident from the outside.

Further, the emission layer 820 is formed on the first electrode 810 and can also be formed on the bank 750. That is, the emission layer 820 can be formed in the emission region EA and the non-emission region NEA.

The emission layer 820 may include a hole transport layer, an organic emission layer, and an electron transport layer. In this instance, when a voltage is applied to the first electrode 810 and the second electrode 830, a hole and an electron move to the organic emission layer through the hole transport layer and the electron transport layer and combine with each other in the organic emission layer to emit light. The emission layer 820 can emit white light and include a plurality of stacks which emit lights of different colors.

As shown, the second electrode 830 is formed on the emission layer 820 and can function as a cathode of the display apparatus. The second electrode 830 can be provided in the emission region EA and the non-emission region NEA like the light emitting device 820. Because the display apparatus according to the first embodiment of the present disclosure is implemented as the top emission type, the second electrode 830 can include a transparent conductive material such as ITO or IZO, so as to upward irradiate light emitted from the emission layer 820.

Further, the plurality of dummy patterns 500 are formed in the second region EA2 of the emission region EA and can include first to third dummy patterns 510 to 530. In more detail, the first dummy pattern 510 is formed on the substrate 100 and can be formed simultaneously through the same process as the blocking layer 200 and include the same material as that of the blocking layer 200.

The buffer layer 300 can extend up to the second region EA2 from the first region EA1 and be formed to cover the first dummy pattern 510, on the substrate 100. The second dummy pattern 520 is formed on the buffer layer 300 and can be formed simultaneously through the same process as the semiconductor layer 410 of the driving TFT 400 and include the same material as that of the semiconductor layer 410.

Further, the gate insulation layer 420 extends up to the second region EA2 from the first region EA1. As shown, the gate insulation layer 420 is formed to cover the second dummy pattern 520, on the buffer layer 300.

In addition, third dummy pattern 530 is formed on the gate insulation layer 420 and can be formed simultaneously through the same process as the gate electrode 430 of the driving TFT 400 and include the same material as that of the gate electrode 430.

Also, each of the first to third dummy patterns 510 to 530 can be electrically cut off and not connected with a signal line or an electrode. Therefore, each of the first to third dummy patterns 510 to 530 does not transfer an electrical signal or a voltage to the another element. Also, the first to third dummy patterns 510 to 530 can be formed to overlap each other.

Further, the interlayer insulation layer 600 extends up to the second region EA2 from the first region EA1. The interlayer insulation layer 600 can also be formed to cover the third dummy pattern 530, on the gate insulation layer 420.

In addition, as shown, the drain electrode 442 of the driving TFT 400 extends up to the second region EA2 from the first region EA1. The drain electrode 442 can also be formed to overlap the first to third dummy patterns 510 to 530, on the interlayer insulation layer 600.

As shown, the passivation layer 650 extends up to the second region EA2 from the first region EA1 and can be formed to cover the drain electrode 442 of the driving TFT 400. The planarization layer 700 extends up to the second region EA2 from the first region EA1 and can be formed to cover the passivation layer 650.

Further, the light emitting device 800 can extend up to the second region EA2 from the first region EA1. Also, the first electrode 810 is electrically connected with the drain electrode 442 through a contact hole H. That is, in the second region EA2, the contact hole H passing through the passivation layer 650 and the planarization layer 700 is formed for exposing the drain electrode 442 of the driving TFT 400. In this instance, the contact hole H can be formed to overlap the first to third dummy patterns 510 to 530.

Next, FIG. 1 is a cross-sectional view of a related art display apparatus. Referring to FIG. 1, in order to increase an opening ratio of an emission region EA, a drain electrode 442 is electrically connected with a light emitting device 800 in the emission region EA.

In more detail, as shown in FIG. 1, the emission region EA includes a first region EA1 where a driving TFT 400 is formed and a second region EA2 where the driving TFT 400 is not formed. In this instance, the drain electrode 442 of the driving TFT 400 extends up to the second emission region EA2 from a semiconductor layer 410. As shown, in the second region EA2, only a substrate 100, a buffer layer 300, and a plurality of insulation layers such as a gate insulation layer 420 are disposed under the drain electrode 442. That is, a thickness of a plurality of material layers formed under the drain electrode 442 is less in the second region EA2 than the first region EA1.

A planarization layer 700 is also formed in the first regions EA1 and EA2, and an upper surface thereof if formed flat, for the stable deposition of a light emitting device 800. Therefore, a thickness of the planarization layer 700 is formed to be greater in the second region EA2 than the first region EA1. In this instance, in order to electrically connect the drain electrode 442 with the light emitting device 800, a contact hole H is formed in the planarization layer 700 in the second region EA2.

However, an angle between a depth of the contact hole H and each of a lateral surface and a lower surface of the contact hole H is increased based on the thickness of the planarization layer 700, and thus a problem occurs where the light emitting device 800 is not stably deposited. For example, as a thickness of the emission layer 820 is reduced in the contact hole H, the emission efficiency decreases, or a phenomenon where a current concentrate thereon can occur. Alternatively, a second electrode 830 can be short-circuited in the contact hole H.

However, in the present disclosure, the plurality of dummy patterns 500 are stacked under the contact hole H, and thus, compared to the related art structure illustrated in FIG. 1, a thickness of the planarization layer 700 formed in the second region EA2 is decreased. That is, compared to the related art structure illustrated in FIG. 1, the present disclosure decreases a thickness of the planarization layer 700 of a region adjacent to the contact hole H. Therefore, the depth of the contact hole H and the angle between each of the lateral surface and the lower surface of the contact hole H decreases, and thus, a problem described above with reference to FIG. 1 can be solved. That is, the emission layer 820 and the second electrode 830 can be stably formed in the contact hole H. Also, the plurality of dummy patterns 500 can be formed simultaneously in a process of forming the driving TFT 400, and thus, an additional process can be omitted.

Figure 3:
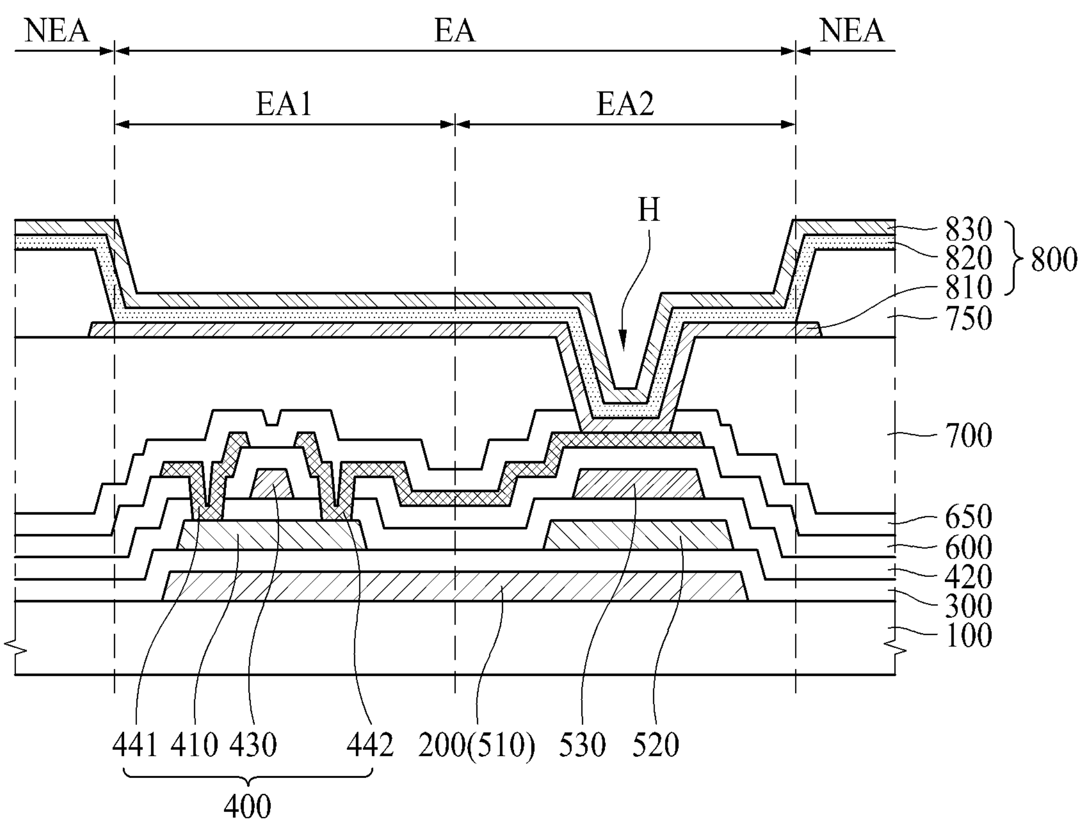
FIG. 3 is a cross-sectional view of a display apparatus according to a second embodiment of the present disclosure.

Next, FIG. 3 is a cross-sectional view of a display apparatus according to a second embodiment of the present disclosure. As described above in FIG. 2, each of the plurality of dummy patterns 500 is cut off, and thus, is not connected with a signal line or an electrode. However, in an alternative embodiment as shown in FIG. 3, at least one of the plurality of dummy patterns 500 can be connected with the signal line or the electrode.

In more detail, except for a blocking layer 200 and a first dummy pattern 510, the display apparatus of FIG. 3 is substantially the same structure as that of the display apparatus of FIG. 2. Accordingly, the same elements as the elements of the display apparatus illustrated in FIG. 2 are referred to by like reference numerals, and repeated descriptions are omitted.

Referring to FIG. 3, the first dummy pattern 510 extends toward a first region EA1 from a second region EA2 and is connected with a blocking layer 200. Alternatively, the blocking layer 200 can extend toward the second region EA2 from the first region EA1 and be connected with the first dummy pattern 510. Also, as described above, the blocking layer 200 and the first dummy pattern 510 can be formed of the same material through the same process, and thus, there is no boundary region between the blocking layer 200 and the first dummy pattern 510. That is, the blocking layer 200 and the first dummy pattern 510 are provided as one body.

Therefore, comparing with the first embodiment, an etching process for detaching the blocking layer 200 from the first dummy pattern 510 can be omitted when forming the blocking layer 200 and the first dummy pattern 510, and thus, a process is simplified. Also, the blocking layer 200 can be formed in all of the first and second regions EA1 and EA2, and thus, light incident from the outside is more effectively blocked.

In FIG. 3, the blocking layer 200 is connected with the first dummy pattern 510, but embodiments of the present disclosure are not limited thereto. For example, the first dummy pattern 510 can be formed to be connected with an adjacent signal line or electrode other than the blocking layer 200. Alternatively, a second dummy pattern 520 or a third dummy pattern 530 can be formed to be connected with an adjacent signal line or electrode.

Figure 4:
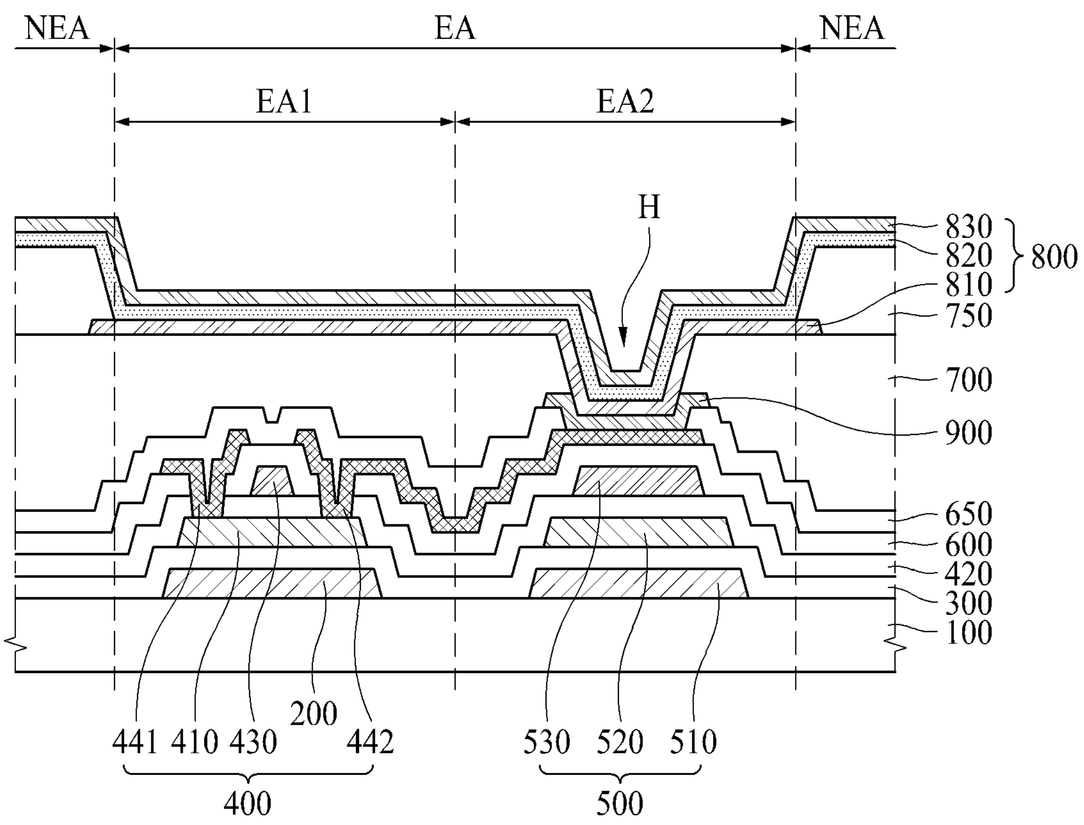
FIG. 4 is a cross-sectional view of a display apparatus according to a third embodiment of the present disclosure.

Next, FIG. 4 is a cross-sectional view of a display apparatus according to a third embodiment of the present disclosure. Except for a configuration of a clad layer 900, the display apparatus of FIG. 4 is substantially the same structure as that of the display apparatus of FIG. 1. Accordingly, the same elements as the elements of the display apparatus illustrated in FIG. 3 are referred to by like reference numerals, and repeated descriptions are omitted.

In addition, the display apparatus according to the present disclosure can include a pad electrode for applying a source voltage from an external power source to a driving TFT 400. Also, a clad layer covering the pad electrode can be formed for preventing the corrosion and damage of the pad electrode. In this instance, referring to FIG. 4, through the same process, the clad layer 900 can be formed on a passivation layer 650 in a second region EA2.

The clad layer 900 may include a metal material such as Al, Ag, Mo, Ti, W, or Cr, or an alloy thereof. Also, the clad layer 900 is illustrated as a single layer, but is not limited thereto and may be formed of a multilayer. Further, the clad layer 900 can extend in a direction in which a contact hole H is formed and be electrically connected with a drain electrode 442 through the contact hole H. Also, the clad layer 900 can be formed to cover all of a front surface of the drain electrode 442 exposed by the contact hole H.

As shown, a planarization layer 700 is formed on a passivation layer 650 and the clad layer 900, and a light emitting device 800 is formed on the planarization layer 700. In this instance, a first electrode 810 is electrically connected with the clad layer 900 through the contact hole H. Because the clad layer 900 is electrically connected with the drain electrode 442 through the contact hole H, the first electrode 810 is electrically connected with the drain electrode 442.

Therefore, comparing with the first embodiment, the clad layer 900 can be additionally formed under the contact hole H, and thus, a thickness of the planarization layer 700 covering the drain electrode 442 can be more reduced. Accordingly, the depth of the contact hole H and the angle between each of a lateral surface and a lower surface of the contact hole H decreases more, and thus, the light emitting device 800 can be more stably formed.

In addition, the clad layer 900 can be formed to cover all of the front surface of the drain electrode 442 exposed by the contact hole H, and thus, the drain electrode 442 is not exposed at the outside by the clad layer 900. Accordingly, the corrosion or damage of the drain electrode 442 caused by an etchant used for etching the planarization layer 700 can be prevented in a process of forming the contact hole H in a planarization layer 700. Also, because the clad layer 900 is formed simultaneously in a conventional process of forming a clad layer on a pad electrode, an additional process can be omitted.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:

a substrate;

a thin film transistor (TFT) provided on a first emission region of the substrate;

a plurality of conductive dummy patterns provided on a second emission region of the substrate adjacent to the first emission region;

a planarization layer provided on the TFT and the plurality of conductive dummy patterns;

a light emitting device including a first electrode provided on the planarization layer, an emission layer provided on the first electrode, and a second electrode provided on the emission layer; and a bank provided on the planarization layer and on a non-emission region of the substrate, which is a region excluding the first emission region and the second emission region, wherein a drain electrode of the TFT extends from the first emission region to the second emission region and is electrically connected with the first electrode of the light emitting device, and wherein the plurality of conductive dummy patterns does not overlap with the bank in the non-emission region of the substrate.

2. The display apparatus of claim 1, further comprising:

a blocking layer provided on the substrate in the first emission region, wherein the TFT overlaps the blocking layer.

3. The display apparatus of claim 2, wherein the TFT further comprises:

a semiconductor layer provided on the blocking layer;

a gate insulation layer provided on the semiconductor layer;

a gate electrode provided on the gate insulation layer; and a source electrode connected to a first side of the semiconductor layer, and wherein the drain electrode is connected to a second side of the semiconductor layer.

4. The display apparatus of claim 3, wherein the plurality of conductive dummy patterns comprise:

a first conductive dummy pattern provided on the substrate;

a second conductive dummy pattern provided on the first conductive dummy pattern; and a third conductive dummy pattern provided on the second conductive dummy pattern, and wherein the drain electrode of the TFT extends from the first emission region to the third conductive dummy pattern in the second emission region.

5. The display apparatus of claim 4, wherein the drain electrode overlaps the first to third conductive dummy patterns.

6. The display apparatus of claim 5, wherein, in the second emission region, the light emitting device is electrically connected with the drain electrode through a contact hole formed in the planarization layer, and wherein the contact hole overlaps the first to third conductive dummy patterns.

7. The display apparatus of claim 6, further comprising:

a clad layer provided between the drain electrode and the planarization layer, in the second emission region, wherein the contact hole exposes a partial region of the clad layer, and the drain electrode and the light emitting device are electrically connected with each other through the clad layer.

8. The display apparatus of claim 4, wherein each of the first to third conductive dummy patterns is insulated.

9. The display apparatus of claim 4, wherein the first conductive dummy pattern is provided on a same layer as the blocking layer, wherein the second conductive dummy pattern is provided on a same layer as the semiconductor layer, and wherein the third conductive dummy pattern is provided on a same layer as the gate electrode.

10. The display apparatus of claim 4, wherein at least one of the first to third conductive dummy patterns is provided on the same layer as an adjacent electrode.

11. The display apparatus of claim 10, wherein the first conductive dummy pattern is connected with the blocking layer.

12. The display apparatus of claim 1, further comprising:

a blocking layer provided on the substrate in the first emission region, wherein the plurality of conductive dummy patterns comprises a first conductive dummy pattern provided on the substrate in the second emission region and includes a same material as the blocking layer.

13. The display apparatus of claim 12, further comprising:

a buffer layer covering the first conductive dummy pattern and the blocking layer.

14. The display apparatus of claim 13, wherein the plurality of conductive dummy patterns comprises a second conductive dummy pattern provided on the buffer layer in the second emission region and overlapping with the first conductive dummy pattern.

15. The display apparatus of claim 14, wherein the TFT further comprises:

a semiconductor layer provided on the buffer layer and overlapping with the blocking layer;

a gate insulation layer provided on the semiconductor layer and extending to cover the second conductive dummy pattern;

a gate electrode provided on the gate insulation layer; and a source electrode connected to a first side of the semiconductor layer, and wherein the drain electrode is connected to a second side of the semiconductor layer.

16. The display apparatus of claim 15, wherein the second conductive dummy pattern comprises a same material as the semiconductor layer of the TFT.

17. The display apparatus of claim 16, wherein the plurality of conductive dummy patterns comprise a third conductive dummy pattern provided on the gate insulation layer and overlapping with the second conductive dummy pattern, and wherein the third conductive dummy pattern comprises a same material as the gate electrode of the TFT.

18. The display apparatus of claim 17, further comprising:

an interlayer insulation layer covering the third conductive dummy pattern and the gate electrode of the TFT, wherein the drain electrode of the TFT is provided on the interlayer insulation layer and overlaps with the third conductive dummy pattern in the second emission region.

19. The display apparatus of claim 18, wherein the first conductive dummy pattern has a first width, the second conductive dummy pattern has a second width less than the first width, and the third conductive dummy pattern has a third width less than the second width, and wherein the first, second and third conductive dummy patterns overlap with each other.

20. The display apparatus of claim 19, further comprising:

a passivation layer provided on the drain electrode of the TFT, wherein the passivation layer comprises a contact hole and overlaps with the third conductive dummy pattern, and wherein the first electrode of the light emitting device is electrically connected with the drain electrode through the contact hole in the passivation layer.

* * * * *